(12) United States Patent
Nilsson

(10) Patent No.: US 6,724,249 B1
(45) Date of Patent: Apr. 20, 2004

(54) MULTI-LEVEL CLASS-D AMPLIFIER BY MEANS OF 3 PHYSICAL LEVELS

(75) Inventor: Johan Nilsson, Lund (SE)

(73) Assignee: Dialog Semiconductor GmbH, Kirchheim/Teck-Nabern (DE)

(*) Notice: Subject to any disclaimer, the term of this patent is extended or adjusted under 35 U.S.C. 154(b) by 10 days.

(21) Appl. No.: 10/304,784

(22) Filed: Nov. 26, 2002

(30) Foreign Application Priority Data

Nov. 7, 2002 (EP) .............................. 02392019

(51) Int. Cl.[7] .............................................. H03F 2/217
(52) U.S. Cl. ...................... 330/10; 330/207 A; 330/251
(58) Field of Search .............................. 330/10, 207 A, 330/251

(56) References Cited

U.S. PATENT DOCUMENTS

| | | | |
|---|---|---|---|
| 5,245,345 A | 9/1993 | Kohdaka et al. ............ | 341/152 |
| 5,617,058 A | 4/1997 | Adrian et al. ................ | 330/10 |
| 5,847,602 A | 12/1998 | Su .............................. | 330/10 |
| 5,949,282 A | 9/1999 | Nguyen et al. ............. | 330/10 |
| 5,974,089 A | 10/1999 | Tripathi et al. ............. | 375/247 |
| 6,014,055 A | 1/2000 | Chester ....................... | 330/10 |
| 6,466,087 B2 | 10/2002 | Ruha .......................... | 330/10 |
| 6,636,113 B1 * | 10/2003 | Kirn ............................ | 330/10 |

FOREIGN PATENT DOCUMENTS

| | | | | |
|---|---|---|---|---|
| DE | 10027164 A1 | 12/2001 | ............ | H04R/3/00 |
| EP | 1028524 A1 | 8/2000 | ............ | H03F/3/217 |

OTHER PUBLICATIONS

Floros et al., "A Novel and Efficient PCM to PWM Converter for Digital Audio Amplifiers", Electronics, Circuits and Systems, 1999 IEEE, pp. 165–168.

Craven, "Toward the 24–bit DAC:Novel Noise–Shaping Topologies Incorporating Correction for the Nonlinearity in a PWM output Stage", J. Audio Eng. Soc. vol. 41, No. 5, May 1993, pp. 291–313.

* cited by examiner

Primary Examiner—Michael B Shingleton
(74) Attorney, Agent, or Firm—George O. Saile; Stephen B. Ackerman

(57) ABSTRACT

A method to generate virtual multi-level output pulses for a Class-D Amplifier, where the time-voltage-area corresponds to a multiple of digital levels is achieved. A class-D Amplifier using PDM (Pulse Density Modulation) normally converts the input signal with a Sigma Delta Modulator into high-frequency pulses of equal width and typically drives an H-Bridge, with its 3 physical output levels. The disclosed invention however adds the methods to produce pulses with a multiple of discrete values of width and provides the method to generate a pulse length select control signal for these variable-width-pulses. Using multi-level pulse widths, in contrast to just a single pulse width, allows the reduction of the pulse-sampling rate by the same factor. Or Multi-level pulse widths allow a better quality output signal. In addition, better power efficiency is achievable.

36 Claims, 3 Drawing Sheets

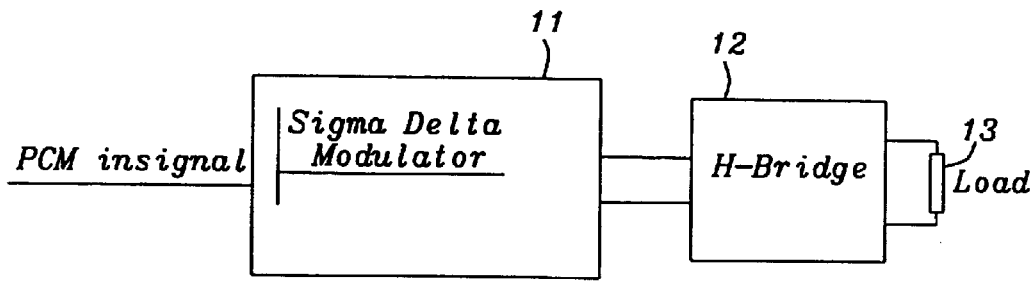
FIG. 1 — Prior Art
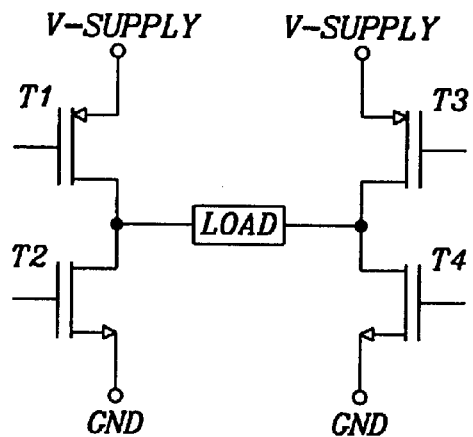
FIG. 2a — Prior Art
| +V | Transistor T1 and T4 open, T2 and T3 closed | 21 |
| ±0 | Transistor T2 and T4 open, T1 and T3 closed | 22 |
| +V | Transistor T2 and T3 open, T1 and T4 closed | 23 |
FIG. 2b — Prior Art

MULTI-LEVEL CLASS-D AMPLIFIER BY MEANS OF 3 PHYSICAL LEVELS

RELATED PATENT APPLICATION

This application is related to U.S. patent applications Ser. No. 10/336,967, filed on Jan. 6, 2003, and Ser. No. 10/350,836, filed on Jan. 24, 2003, and assigned to the same assignee as the present invention.

BACKGROUND OF THE INVENTION

(1) Field of the Invention

The invention relates to a Class-D Power Amplifier, and more particularly, to a Class-D Power Amplifier having a pulse coded digital input signal and typically using an H-Bridge to drive an output load, like a loudspeaker.

(2) Description of the Prior Art

Class-AB amplifiers are notoriously inefficient and Class-D amplifiers overcome this shortfall. With Class D amplifiers, the output is made to switch between the two output levels at a very high frequency—substantially higher than the highest audible frequency, which is done by feeding high-frequency pulses to the power amplification stage. Either the pulse-width ratio of the driving signal can be varied at a constant frequency or the pulse density of the driving signal can be varied at a constant pulse width in order to make the averaged (filtered) output signal follow the (amplified) input signal very closely. Such amplifier is referred to as Pulse Width Modulated (PWM) or Pulse Density Modulated (PDM). The output voltage at the load, after passing a low pass filter, represents the input under the assumption of a constant the supply voltage.

In the case of Pulse Density Modulation, the pulse width is always constant, where the high frequency pulses can be generated by for example a Sigma Delta Modulator. The output device, a Class-D driver, can only provide +V or −V or zero, thus limiting the pulse generation to a maximum of 3 levels. This limited number of levels also limits the signal accuracy.

FIG. 1 shows a schematic block diagram of a state-of-the-art PDM Class-D Amplifier. It typically comprises a Sigma Delta Modulator (11) to generate the driving signal for the Class-D power output stage, which is typically an H-Bridge (12) and the output load, often a loudspeaker (13).

FIG. 2a shows a simplified diagram of an H-Bridge and FIG. 2b shows the 3 output signal levels and the corresponding states of the output devices. The output level at the load LOAD is "+V" with Transistor T2 and T3 closed, T1 and T4 open (21); it is "−V" with Transistor T1 and T4 closed, T2 and T3 open (22) and it is "±0" with Transistor T1 and T4 closed, T2 and T3 open (23).

U.S. Pat. No. (5,949,282 to Nguyen, Huey, Takagishi, Hideto) describes circuit for, first, generating an accurate reproduction of the output of a Class D amplifier for error-correction purposes, and then, second, comparing the reference signal to the original signal input to the amplifier for error-correcting purposes.

U.S. Pat. No. (5,847,602 to Su, David) shows a delta-modulated magnitude amplifier which is used to amplify the magnitude component of an RF power amplifier that employs envelope elimination and restoration. The delta-modulated amplifier introduces a smaller amount of non-linearity than traditional approaches, which are based upon pulse-width modulation. The disclosed technique can be implemented using switched-capacitor circuits in a standard MOS technology with only two external components, i.e., an inductor and a capacitor. Thus, the disclosed technique allows the implementation of an efficient and yet linear RF power amplifier using low-cost MOS technology.

U.S. Pat. No. (5,974,089 Tripathi, et al) describes an oversampled, noise shaping signal processor having at least one integrator stage in a feedback loop. A sampling stage in the feedback loop is coupled to the at least one integrator stage. The sampling stage samples an analog signal at a sample frequency. Qualification logic coupled to the sampling stage receives a pulse waveform therefrom, and ensures that signal transitions in the pulse waveform occur more than a first time period apart and that the waveform can therefore be handled by, for example, a power switching device. A switching stage in the feedback loop is coupled to the qualification logic. The signal processor has a feedback path from the output of the switching stage to the input of the at least one integrator stage thereby closing the feedback loop.

SUMMARY OF THE INVENTION

In accordance with the objectives of this invention, a circuit to generate virtual multi-level output pulses for a Class-D Amplifier, where the time-voltage-area corresponds to a multiple of digital levels, is achieved. Multi-level pulse widths allow a better quality output signal. Also, using multi-level pulse widths, in contrast to just a single pulse width, allows the reduction of the pulse-sampling rate by the same factor.

A Class-D Amplifier using PDM (Pulse Density Modulation) normally converts the input signal with a Sigma Delta Modulator into high-frequency pulses of equal width. And a Class-D amplifier typically uses an H-Bridge with its 3 switching levels (+V, −V, 0) to drive an output load through a low-pass filter. Typical loads are a loudspeaker or a servo-motor.

The fundamental idea of the disclosed invention is to add the circuits and methods to produce pulses with a multiple of discrete values-of-width and to provide the method to generate a pulse length select signal for these variable-width-pulses. Now the output signal has virtual multi-level pulses with only 3 physical levels.

To achieve this, the processing unit for the input signal converter, typically containing a Sigma Delta Modulator, not only generates the digital signals "Pulse active" and "Pulse pos/neg", but also a digital "Pulse length select" signal. A "Length of Pulse Integrator" Function then takes the pulse start information and starts integrating. When the integrated value reaches a specific reference level, selected by the pulse-length-select signal out of a set of pulse area reference values, the integration stops the output signal pulse and generates the pulse stop information. The proposed circuit may contain different techniques to define a set of output pulse area reference values, one for each step of said multi-level output.

The circuit also comprises a "Pulse Generator Unit" inserted into the signal path between said converter of PCM signals and the Class-D output power stage, which is, as said before, typically an H-Bridge. Said H-Bridge then drives voltage into said output load.

Further, in accordance with the objectives of this invention, said pulse area reference levels may not only be of fixed level, but may also be externally controlled.

In accordance with the objectives of this invention, a method to generate virtual multi-level output pulses for a Class-D Amplifier, where the time-voltage-area corresponds to a multiple of digital levels, is achieved. First it converts said input signal into ideal PCM control pulses. In addition to said "pulse active" and "pulse polarity" signal, it also generates said "pulse length select" signal. The proposed method defines said set of output pulse area reference values, one for each step of said multi-level output. The "Length of Pulse Integrator" determines said pulse stop time, based on said pulse start time (clock), on said digital "pulse length select" signal and based on said output pulse area reference values. The "Pulse Generator Unit" generates said multi-level output pulses using said pulse start and pulse stop signals and applies said power driver control pulses to said Class-D power driver. Finally said power driver feeds the output voltage to said output load.

BRIEF DESCRIPTION OF THE DRAWINGS

In the accompanying drawings, forming a material part of this description, there is shown.

FIG. 1 (Prior Art) shows the schematic block diagram for a prior art solution.

FIGS. 2a and 2b (Prior Art) shows a principal circuit of an H-Bridge and the output level states.

DESCRIPTION OF THE PREFERRED EMBODIMENTS

The objectives of this invention are to generate virtual multi-level output pulses for a Class-D Amplifier, where the time-voltage-area corresponds to a multiple of digital levels. A Class-D Amplifier using PDM (Pulse Density Modulation) normally converts the input signal with a Sigma Delta Modulator into high-frequency pulses of equal width. And a Class-D amplifier typically uses an H-Bridge with its 3 switching levels (+V, −V, 0) to drive an output load through a low-pass filter. Typical loads are a loudspeaker or a servo-motor.

The fundamental idea of the disclosed invention is to add the circuits and methods to produce pulses with a multiple of discrete values-of-width and to provide the method to generate a pulse length select signal for these variable-width-pulses. Now the output signal has virtual multi-level pulses with only 3 physical levels.

Multi-level pulse widths allow a better quality output signal. Also, using multi-level pulse widths, in contrast to just a single pulse width, allows the reduction of the pulse-sampling rate. In addition, better power efficiency is achieved, as well as lower EMI.

Figure 3:
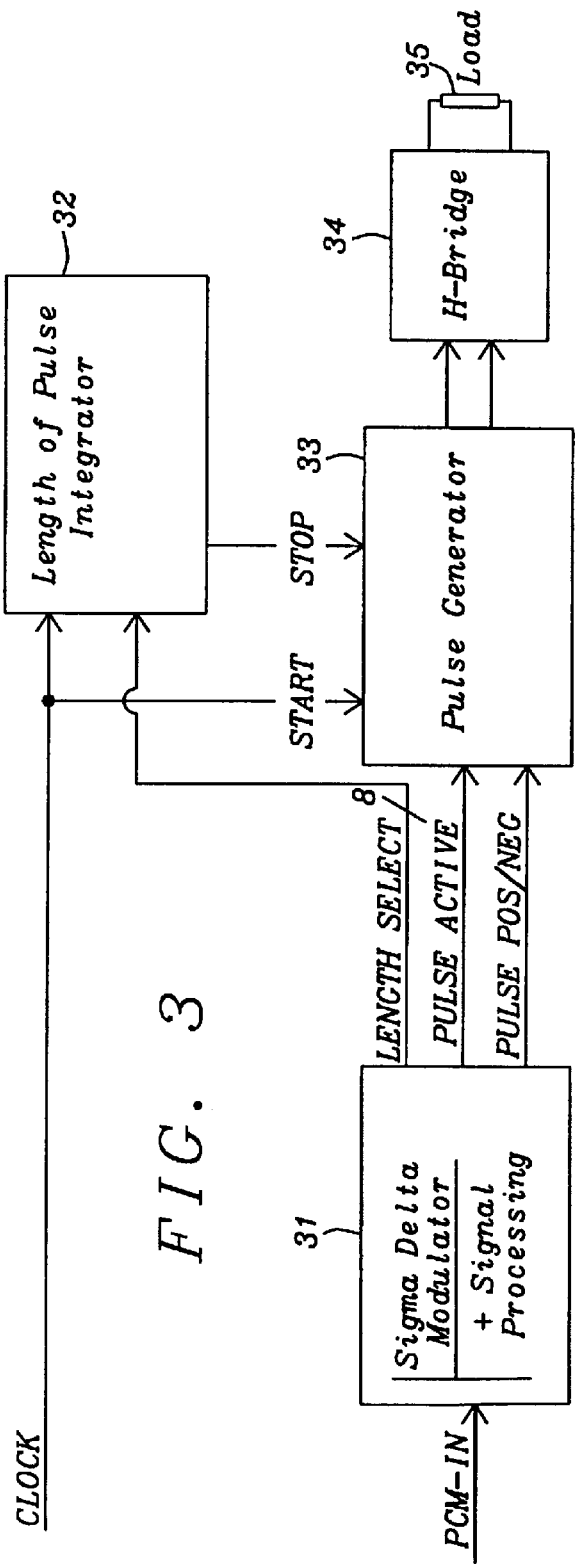
FIG. 3 shows the schematic block diagram for a solution, in accordance with an embodiment of this invention.

FIG. 3 shows a schematic block diagram as disclosed in this invention.

To achieve this, the processing unit (31) for the input signal converter, typically comprising a Sigma Delta Modulator, not only generates the digital signals "Pulse active" and "Pulse pos/neg", but also a digital "Pulse length select" signal. A "Length of Pulse Integrator" Function (32) then takes the pulse start information and starts integrating. When the integrated value reaches a specific reference level, selected by the pulse-length-select signal out of a set of pulse area reference values, the integration stops the output signal pulse and generates the pulse stop information. The proposed circuit may contain different techniques to define a set of output pulse area reference values, one for each step of said multi-level output.

The circuit also comprises a "Pulse Generator Unit" (33) inserted into the signal path between said converter of PCM signals and the Class-D output power stage, which is, as said before, typically an H-Bridge (34). Said H-Bridge then drives voltage into said output load.

Said H-Bridge finally drives the output load (35), typically a loudspeaker.

Figure 4:
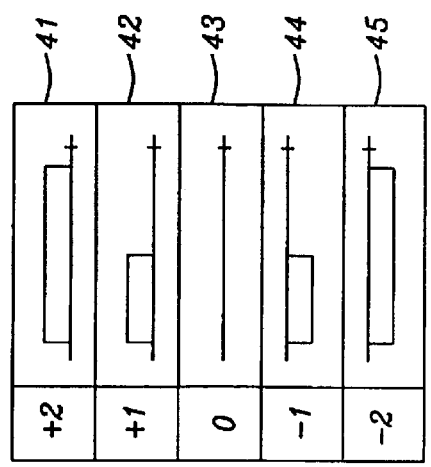
FIG. 4 shows the concept of multi-level pulses; the example shows a 5 level system.

FIG. 4 shows the pulse forms for 5 level system. It shows the pulse for the 5 levels "+2" (41), for the "+1" (42), for the "0" (43), for the "−1" (44) and for the "−2" (45).

Figure 5:
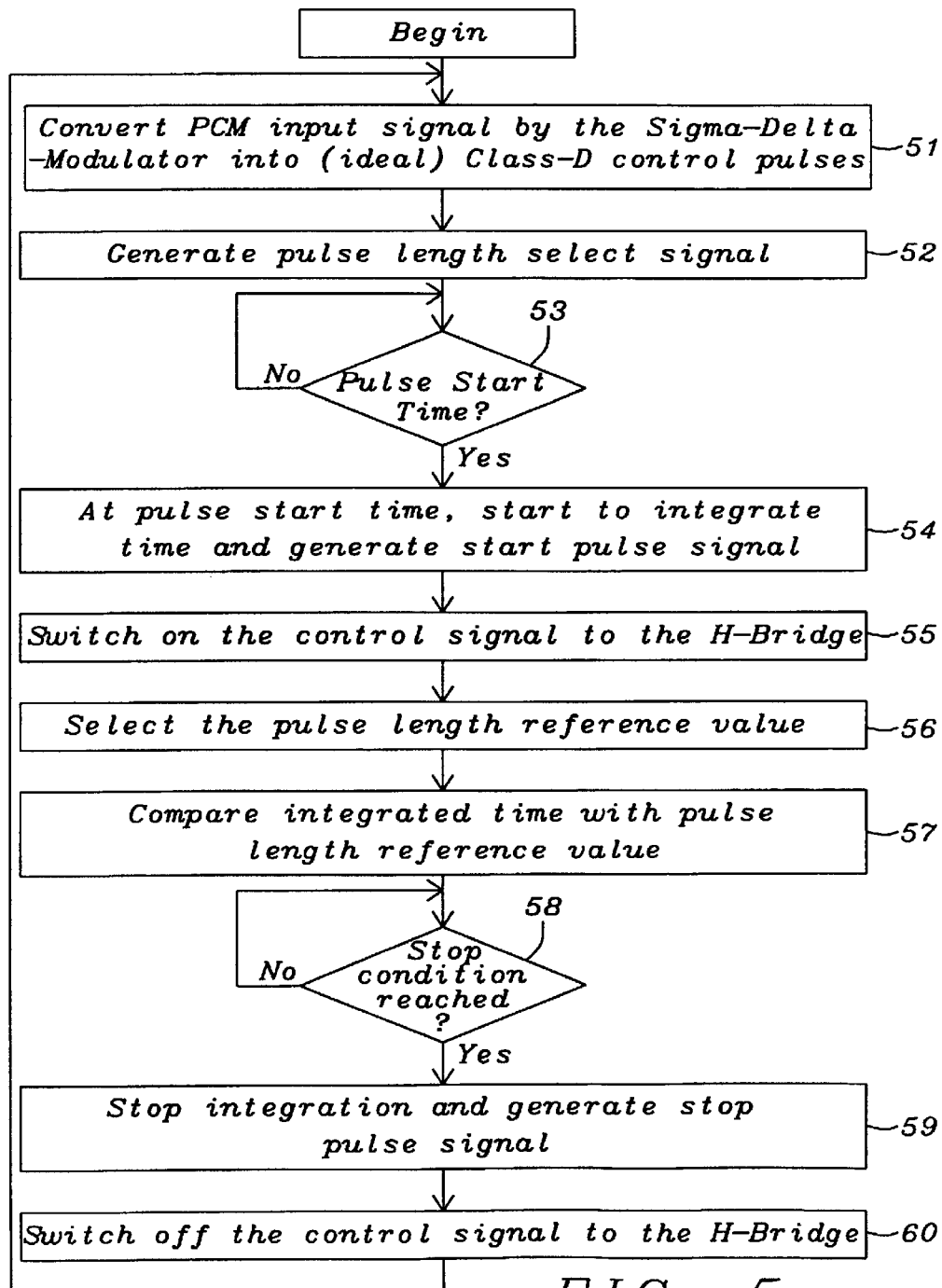
FIG. 5 shows a method to generate virtual multi-level output pulses for a Class-D Amplifier.

The method to achieve the objectives of this invention is illustrated in FIG. 5.

First, in step 51, the input signal is converted by the Sigma-Delta-Modulator into high frequency Multi-Level-PDM pulses. At the same time, the converter generates the pulse length select signal (52). Now at pulse start time (53), said Pulse-Length-Integrator starts to integrate the time and generates the start pulse signal (54). Now the Pulse-Generator Switch on the control signal to the H-Bridge (55). The pulse area reference value is selected through the pulse length select signal (56). Said Pulse-Length-Integrator comprises the integrated time value with selected pulse length reference value. As soon as the Stop condition reached (58), the Length-of-Pulse integrator stops integrating and generates the pulse stop signal (59) and the control signal to the H-Bridge is switched off (60

While the invention has been particularly shown and described with reference to the preferred embodiments thereof, it will be understood by those skilled in the art that various changes in form and details may be made without departing from the spirit and scope of the invention.

What is claimed is:

1. A circuit to generate virtual multi-level output pulses for a Class-D Amplifier, where the time-voltage-area corresponds to a multiple of digital levels, comprising:
   means to convert the input signal into ideal PDM (Pulse Density Modulated) output pulses;
   means to generate a "pulse polarity" and a digital "pulse length select" signal, where said pulse length select signal represents multiple pulse-area values;
   means to define a set of output pulse area reference values, one for each step of said multi-level output;
   a length-of-pulse-integrator to determine the pulse stop time, based on the pulse start time (clock), on said digital "pulse length select" signal and based on said output pulse area reference values;
   a pulse generator providing the multi-level output pulses to said power driver, using said pulse start and pulse stop signals;
   means for a Class-D power driver to drive voltage into an output load, controlled by said power driver control pulses; and
   means for an output load as the amplifier output's target.

2. The circuit of claim 1 wherein said input signal is an analog signal.

3. The circuit of claim 1 wherein said input signal is a digital signal with low sampling rate and high bit resolution.

4. The circuit of claim 1 wherein said means to convert the PCM (Pulse Code Modulated) input to power driver control pulses contains a Sigma Delta Modulator.

5. The circuit of claim 1 wherein said means to generate a "pulse polarity" and a digital "pulse length select" signal is an integrated part of the Pulse Density Modulator implementation.

6. The circuit of claim 1 wherein said digital "pulse length select" signal is a multi-bit control function.

7. The circuit of claim 1 wherein said means to define the set of output pulse area references has at least 2 values.

8. The circuit of claim 1 wherein said means to define the set of output pulse area references assume a set of fixed and a priori known magnitudes.

9. The circuit of claim 1 wherein said means to define the set of output pulse area references is uses a single value, which is then further divided into said set of output pulse area references.

10. The circuit of claim 7 wherein said single value, to calculate said set of output pulse area references, receives this value as an external control definition.

11. The circuit of claim 1 wherein said means for a Class-D power driver is an H-Bridge.

12. The circuit of claim 1 wherein said means to convert the PCM (Pulse Code Modulated) input signal is implemented as an integrated digital logic function.

13. The circuit of claim 1 wherein said means to convert the PCM (Pulse Code Modulated) input signal is implemented as a calculating algorithm in a digital signal processor.

14. The circuit of claim 1 wherein said means to generate a "pulse polarity" and a digital "pulse length select" signal is implemented as an integrated digital logic function.

15. The circuit of claim 1 wherein said means to generate a "pulse polarity" and a digital "pulse length select" signal is implemented as a calculating algorithm in a digital signal processor.

16. The circuit of claim 1 wherein said length-of-pulse-integrator to determine the pulse stop time, based on said pulse start time, said digital "pulse length select" signal and said output pulse area reference values, is implemented as an analog integrated function.

17. The circuit of claim 1 wherein said length-of-pulse-integrator to determine the pulse stop time, based on said pulse start time, said digital "pulse length select" signal and said output pulse area reference values, is implemented as an integrated digital logic function.

18. The circuit of claim 1 wherein said length-of-pulse-integrator to determine said pulse stop time, based on said pulse start time, said digital "pulse length select" signal and said output pulse area reference values, is implemented as a calculating algorithm in a digital signal processor.

19. The circuit of claim 1 wherein said pulse generator providing said multi-level output pulses for said power driver is implemented as an integrated digital logic function.

20. The circuit of claim 1 wherein said pulse generator providing said multi-level output pulses for said power driver is implemented as a calculating algorithm in a digital signal processor.

21. A method to generate virtual multi-level output pulses for a Class-D Amplifier, where the time-voltage-area corresponds to a multiple of digital levels, comprising:

providing means to convert the input signal into ideal PDM (Pulse Density Modulated) power driver control pulses, means to generate a "pulse polarity" and a digital "pulse length select" signal, means to define a set of output pulse area reference values, a length-of-pulse-integrator to determine the pulse stop time, a pulse generator providing the power driver control pulses using, means for a Class-D power driver to drive voltage into an output load and means for an output load;

converting said input signal into ideal PDM control pulses;

generating said "pulse polarity" and said digital "pulse length select" signal, where said pulse length select signal represents multiple pulse-area values;

defining said set of output pulse area reference values, one for each step of said multi-level output;

determining said pulse stop time, based on said pulse start time (clock), on said digital "pulse length select" signal and based on said output pulse area reference values;

generating said multi-level output pulses using said pulse start and pulse stop signals;

applying said power driver control pulses to said Class-D power driver; and driving said power driver's output voltage to the output load (typically a loudspeaker).

22. The method of claim 18 wherein converting said input signal into ideal PDM control pulses is done by a processing unit containing a Sigma Delta Modulator.

23. The method of claim 21 wherein generating said "pulse polarity" and a digital "pulse length select" signal is an integrated with the method to convert said Pulse Density Modulator signal as a combined function.

24. The method of claim 21 wherein defining the set of output pulse area references uses at least 2 values.

25. The method of claim 21 wherein defining the set of output pulse area references assume a set of fixed and a priori known magnitudes.

26. The method of claim 21 wherein defining the set of output pulse area references takes a single fixed value and then further divides it into said set of output pulse area references.

27. The method of claim 21 wherein an H-Bridge is used for driving voltage to said output load.

28. The method of claim 21 wherein converting said input signal into ideal PDM power driver control pulses is implemented by an integrated digital logic function.

29. The method of claim 21 wherein converting said input signal into ideal PDM power driver control pulses is implemented by a calculating algorithm in a digital signal processor.

30. The method of claim 21 wherein generating said "pulse polarity" and said digital "pulse length select" signal is implemented by an integrated digital logic function.

31. The method of claim 21 wherein generating said "pulse polarity" and said digital "pulse length select" signal is implemented by a calculating algorithm in a digital signal processor.

32. The method of claim 21 wherein determining said pulse stop time, based on said pulse start time (clock), on said digital "pulse length select" signal and based on said output pulse area reference values is implemented by an integrated analog function.

33. The method of claim 21 wherein determining said pulse stop time, based on said pulse start time (clock), on said digital "pulse length select" signal and based on said output pulse area reference values is implemented by an integrated digital logic function.

34. The method of claim 21 wherein determining said pulse stop time, based on said pulse start time (clock), on said digital "pulse length select" signal and based on said output pulse area reference values is implemented by a calculating algorithm in a digital signal processor.

35. The method of claim 21 wherein generating said multi-level power driver control pulses is performed in an integrated digital logic function.

36. The method of claim 21 wherein generating said multi-level power driver control pulses is performed in a calculating algorithm in a digital signal processor.

* * * * *